United States Patent
Lee et al.

(10) Patent No.: US 6,849,375 B2
(45) Date of Patent: Feb. 1, 2005

(54) PHOTORESIST MONOMERS, POLYMERS THEREOF AND PHOTORESIST COMPOSITIONS CONTAINING THE SAME

(75) Inventors: Geun Su Lee, Kyoungki-do (KR); Jae Chang Jung, Kyoungki-do (KR); Ki Soo Shin, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 75 days.

(21) Appl. No.: 10/080,319

(22) Filed: Feb. 21, 2002

(65) Prior Publication Data

US 2003/0022101 A1 Jan. 30, 2003

(30) Foreign Application Priority Data

Jun. 29, 2001 (KR) ........................................ 2001-38026

(51) Int. Cl.$^7$ ............................................. G03F 7/039
(52) U.S. Cl. .................... 430/270.1; 430/296; 430/913; 526/242; 526/247; 526/250; 526/253; 526/309
(58) Field of Search ............................. 430/270.1, 296, 430/913, 905, 907; 526/242, 247, 250, 253, 309

(56) References Cited

U.S. PATENT DOCUMENTS

| | | | |
|---|---|---|---|
| 5,962,184 A | 10/1999 | Allen et al. | |
| 6,150,069 A | 11/2000 | Jung et al. | |
| 6,261,676 B1 * | 7/2001 | Olson et al. | 428/221 |
| 6,403,744 B1 * | 6/2002 | Akama et al. | 526/309 |
| 6,403,846 B1 * | 6/2002 | Sekiya et al. | 570/134 |
| 6,642,336 B1 * | 11/2003 | Lee et al. | 526/282 |
| 6,653,047 B2 | 11/2003 | Lee et al. | |
| 2002/0004569 A1 * | 1/2002 | Hatakeyama et al. | 526/242 |

FOREIGN PATENT DOCUMENTS

JP  2001330955 A  * 11/2001  ........... G03F/7/039

OTHER PUBLICATIONS

Machine Translation of JP 2001330955 A (http://www.ipdl.jpo.go.jp/homepg_e.ipdl).*

* cited by examiner

*Primary Examiner*—Yvette C. Thornton
(74) *Attorney, Agent, or Firm*—Marshall, Gerstein & Borun LLP

(57) ABSTRACT

Photoresist monomers of following Formula 1, photoresist polymers thereof, and photoresist compositions containing the same. The photoresist polymers include a repeating unit comprising the photoresist monomer of Formula 1 as a comonomer and the photoresist compositions containing the same have excellent etching resistance, heat resistance and adhesiveness to a wafer, and are developable in aqueous tetramethylammonium hydroxide (TMAH) solutions. In addition, the photoresist compositions have a low light absorbance at 157 nm wavelength, and thus are suitable for a photolithography process using ultraviolet light sources such as VUV (157 nm) in fabricating a minute circuit for a high integration semiconductor device.

Formula 1

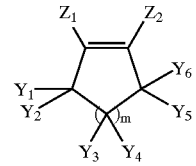

wherein $Y_1$, $Y_2$, $Y_3$, $Y_4$, $Y_5$, $Y_6$, $Z_1$, $Z_2$ and m are defined in the specification.

12 Claims, 3 Drawing Sheets

PHOTORESIST MONOMERS, POLYMERS THEREOF AND PHOTORESIST COMPOSITIONS CONTAINING THE SAME

BACKGROUND

1. Technical Field

Novel photoresist monomers, polymers thereof and photoresist compositions containing the same are disclosed. In particular, photoresist monomers suitable for a photolithography process using DUV (deep ultraviolet) light sources, particularly VUV (vacuum ultraviolet: 157 nm) in fabricating minute circuits for highly integrated semiconductor devices, photoresist polymers thereof and photoresist compositions containing the same, and preparation processes are also disclosed.

2. Description of the Related Art

In general, a useful photoresist for ArF and VUV has a variety of desired characteristics, such as low light absorbance at the wavelength of 193 nm and 157 nm, excellent etching resistance, and excellent adhesiveness to a wafer. In addition, a photoresist should be easily developable in a commercially readily available developing solution, such as 2.38 wt % and 2.6 wt % aqueous tetramethylammonium hydroxide (TMAH) solution.

Recently, much research has been conducted on resins having a high transparency at the wavelength of 248 nm and 193 nm and dry etching resistance similar to novolac resin. However, most of these photoresists are not suitable for VUV due to their poor transmittance at 157 nm wavelength.

In order to solve the problem, research on polyethylene or polyacrylate containing fluorine has been performed. As an example, a tetrafluoroethylene as a monomer has been studied by DuPont. Tetrafluoroethylene is difficult to control and handle effectively when it is polymerized with other comonomers since it exists in gaseous phase. Therefore it yields inconsistent rates of polymerization.

SUMMARY OF THE DISCLOSURE

Accordingly, novel photoresist monomers, polymers thereof and photoresist compositions containing the same are disclosed that can be used for a light sources such as ArF (193 nm) and VUV (157 nm).

Processes for forming a photoresist pattern using the photoresist compositions described above and semiconductor elements produced by using the process described above are also disclosed.

DETAILED DESCRIPTION OF THE PRESENTLY PREFERRED EMBODIMENTS

Figure 1:
FIG. 1 is a photograph of a photoresist pattern obtained in Example 5.

First of all, novel photoresist monomers are represented by following Formula 1:

Formula 1

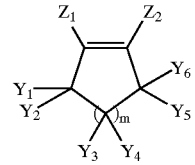

wherein $Y_1$, $Y_2$, $Y_3$, $Y_4$, $Y_5$, $Y_6$, $Z_1$ and $Z_2$ individually represent halogen or alkyl partially or wholly substituted with halogen; and m is an integer ranging from 0 to 2.

Preferably, $Y_1$, $Y_2$, $Y_3$, $Y_4$, $Y_5$, $Y_6$, $Z_1$ and $Z_2$ are individually F, Cl, Br, I or $CF_3$.

Some of preferred photoresist monomers are octafluorocyclopentene or hexafluorocyclobutene.

In addition, photoresist polymers comprise the compound of Formula 1 as a comonomer. The photoresist polymers also comprise a repeating unit represented by following Formula 2 or Formula 3.

Formula 2

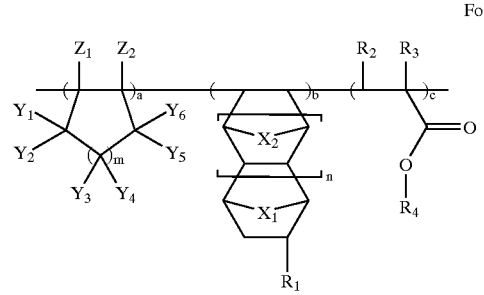

Formula 3

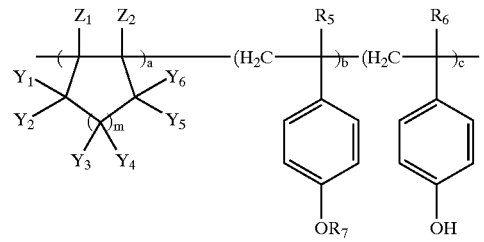

wherein $R_1$ represents H, halogen, ($C_1$–$C_{20}$) alkyl, ($C_1$–$C_{20}$) alkyl with halogen substituent(s), ($C_1$–$C_{20}$) alkyl containing at least one of ether group (—O—) and ester group, ($C_1$–$C_{20}$) alkyl with halogen substituent(s) and containing at least one of ether group and ester group or —COOR';

$R_2$, $R_3$, $R_5$ and $R_6$ individually represent H, halogen, ($C_1$–$C_{20}$) alkyl, ($C_1$–$C_{20}$) alkyl with halogen substituent(s), ($C_1$–$C_{20}$) alkyl containing at least one of ether group and ester group or ($C_1$–$C_{20}$) alkyl with halogen substituent(s) and containing at least one of ether group and ester group;

R', $R_4$ and $R_7$ are individually acid labile protecting groups;

$X_1$ and $X_2$ individually represent ($C_1$–$C_{10}$)alkylene, O or S;

$Y_1$, $Y_2$, $Y_3$, $Y_4$, $Y_5$, $Y_6$, $Z_1$ and $Z_2$ individually represent halogen or alkyl partially or wholly substituted with halogen;

m and n are individually integers ranging from 0 to 2; and the ratio a:b:c has the ranges 1–50 mol %:0–90 mol %:0–90 mol %.

Preferably, $R_2$, $R_3$, $R_5$ and $R_6$ individually represent H, F, ($C_1$–$C_{20}$) alkyl, ($C_1$–$C_{20}$) perfluoroalkyl, ($C_1$–$C_{20}$) alkyl containing at least one of ether group and ester group, ($C_1$–$C_{20}$) perfluoroalkyl containing at least one of ether group and ester group, ($C_1$–$C_{20}$) alkyl partially substituted with F or ($C_1$–$C_{20}$) alkyl partially substituted with F and containing at least one of ether group and ester group; and $Y_1$, $Y_2$, $Y_3$, $Y_4$, $Y_5$, $Y_6$, $Z_1$ and $Z_2$ individually represent F, Cl, Br, I or $CF_3$. More preferably, $R_2$, $R_3$, $R_5$ and $R_6$ are individually H, F, $CH_3$ or $CF_3$.

And the acid labile protecting group can be any of known protecting groups which prevent the compound from dissolving in an alkaline developing solution. However, under the presence of acid, the acid labile group is substituted with acid, thereby making the compound soluble to the alkaline solution.

Some of conventional acid labile protecting groups are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0789 278 (Aug. 13, 1997), U.S. Pat. No. 6,132,926 (Oct. 17, 2000), U.S. Pat. No. 6,143,463 (Nov. 7, 2000), U.S. Pat. No. 6,150,069 (Nov. 21, 2000), U.S. Pat. No. 6,180,316 B1 (Jan. 30, 2001), U.S. Pat. No. 6,225,020 B1 (May 1, 2001), U.S. Pat. No. 6,235,448 B1 (May 22, 2001) and U.S. Pat. No. 6,235,447 B1 (May 22, 2001). Acid labile protecting groups are preferably selected from the group consisting of 2-methyl 2-adamantyl, 2-ethyl 2-adamantyl, 8-ethyl 8-tricyclodecanyl, tert-butyl, tetrahydropyran-2-yl, 2-methyl tetrahydropyran-2-yl, tetrahydrofuran-2-yl, 2-methyl tetrahydrofuran-2-yl, 1-methoxypropyl, 1-methoxy-1-methylethyl, 1-ethoxypropyl, 1-ethoxy-1-methylethyl, 1-methoxyethyl, 1-ethoxyethyl, tert-butoxyethyl, 1-isobutoxyethyl and 2-acetylmenth-1-yl.

Some of preferred repeating units of above Formula 2 include poly(hexafluorocyclobutene/2-methyl 2-adamantyl 5-norbornene-2-carboxylate), poly(octafluorocyclopentene/ 8-ethyl 8-tricyclodecanyl 5-norbornene-2-carboxylate) or poly(octafluorocyclopentene/2-methyl 2-adamantyl 5-norbornene-2-carboxylate/2-ethyl 2-adamantyl acrylate), and one of preferred repeating unit of above Formula 3 is poly(hexafluorocyclobutene/4-ethoxyethoxy styrene/4-hydroxy styrene).

The process for preparing a photoresist polymer comprising the repeating unit of Formula 2 or Formula 3 will now be explained in more detail. The disclosed repeating unit can be prepared by radical polymerization or anion polymerization.

For example, the repeating unit of Formula 2 is prepared according to a process comprising:

(a) admixing (i) a monomer of Formula 1 and optionally (ii) at least one monomer selected from the group consisting of Formula 4 and Formula 5; and (b) adding a radical polymerization initiator into the resultant of step (a) in case of performing a radical polymerization; or adding an anion polymerization catalyst into the resultant of step (a) in case of performing an anion polymerization.

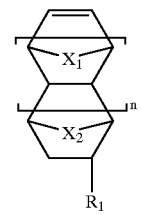

Formula 4

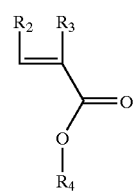

Formula 5 wherein $R_1$ represents H, halogen, ($C_1$–$C_{20}$) alkyl, ($C_1$–$C_{20}$) alkyl with halogen substituent(s), ($C_1$–$C_{20}$) alkyl containing at least one of ether group and ester group, ($C_1$–$C_{20}$) alkyl with halogen substituent(s) and containing at least one of ether group and ester group or —COOR';

$R_2$ and $R_3$ individually represent H, halogen, ($C_1$–$C_{20}$) alkyl, ($C_1$–$C_{20}$) alkyl with halogen substituent(s), ($C_1$–$C_{20}$) alkyl containing at least one of ether group and ester group or ($C_1$–$C_{20}$) alkyl with halogen substituent(s) and containing at least one of ether group and ester group;

R' and $R_4$ are individually acid labile protecting groups;

$X_1$ and $X_2$ individually represent ($C_1$–$C_{10}$)alkylene, O or S; and n is an integer ranging from 0 to 2.

In addition the repeating unit of Formula 3 is prepared according to a process comprising:

(a) admixing (i) a monomer of Formula 1 and optionally (ii) at least one monomer selected from the group consisting of Formula 6 and Formula 7; and (b) adding a radical polymerization initiator into the resultant of step (a) in case of performing a radical polymerization; or adding an anion polymerization catalyst into the resultant of step (a) in case of performing an anion polymerization.

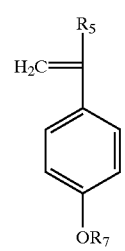

Formula 6

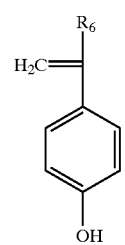

Formula 7 wherein $R_5$ and $R_6$ individually represent H, halogen, ($C_1$–$C_{20}$) alkyl, ($C_1$–$C_{20}$) alkyl with halogen substituent (s), ($C_1$–$C_{20}$) alkyl containing at least one of ether group and ester group or ($C_1$–$C_{20}$) alkyl with halogen substituent (s) and containing at least one of ether group and ester group; and $R_7$ is an acid labile protecting group.

The repeating unit of Formula 3 can be prepared according to the following process as well as polymerizing each comonomer as mentioned above. The process comprises:

(a) polymerizing a monomer of Formula 1 and 4-acetoxy styrene derivative by radical polymerization or anion polymerization;

(b) hydrolyzing the resultant polymer of step (a) to obtain a copolymer comprising the monomer of Formula 1 and 4-hydroxy styrene monomer of Formula 7; and (c) reacting a compound containing acid labile protecting group ($R_7$) with the resultant of step (b) thereby substituting some hydrogens of hydroxyl group with acid labile protecting group to obtain the repeating unit of Formula 3.

In the above process, radical polymerization or anion polymerization can be carried out by bulk polymerization or solution polymerization.

The organic solvents suitable for solution polymerization can be cyclohexanone, cyclopentanone, tetrahydrofuran, dimethylformamide, dimethylsulfoxide, dioxane, methylethylketone, benzene, toluene, xylene or mixtures thereof.

Exemplary polymerization initiators include any conventional radical polymerization initiators such as 2,2'-azobisisobutyronitrile(AIBN), benzoyl peroxide, acetyl peroxide, lauryl peroxide, tert-butyl peracetate or di-tert-butyl peroxide.

And the anion polymerization catalyst include KOH, $NaNH_2$, alkoxide ion, alkali metal, Grignard reagent, or alkyl lithium such as lithium diisopropyl amide or n-BuLi.

Preferably, after polymerization, the repeating unit is subject to crystallization and/or purification by using diethyl ether, petroleum ether, alkane, alcohol, water or mixtures thereof.

A photoresist polymer comprises the above repeating unit in the main chain and further comprises other comonomers or additives if necessary.

In addition, another aspect of the present invention provides a photoresist composition comprising (i) a photoresist polymer described above; (ii) a photoacid generator; and (iii) an organic solvent.

Any of conventional photoacid generator, which is able to generate acids when it is exposed to light, can be used. Some of conventional photoacid generator are disclosed in U.S. Pat No. 5,212,043 (May 18, 1993), WO 97/33198 (Sep.12, 1997), WO 96/37526 (Nov. 28, 1996), EP 0 794 458 (Sep. 10, 1997), EP 0789 278 (Aug. 13, 1997) and U.S. Pat. No. 6,132,926 (Oct. 17, 2000), U.S. Pat. No. 6,143,463 (Nov. 7, 2000), U.S. Pat. No. 6,150,069 (Nov. 21, 2000), U.S. Pat. No. 6,180,316 B1 (Jan. 30, 2001), U.S. Pat. No. 6,225,020 B1 (May 1, 2001), U.S. Pat. No. 6,235,448 B1(May 22, 2001) and U.S. Pat. No. 6235447 B1 (May 22, 2001).

Preferred photoacid generators have relatively low light absorbance in the wavelength of 157 nm and 193 nm. More preferred photoacid generator is phthalimidotrifluoromethane sulfonate, dinitrobenzyltosylate, n-decyl disulfone, naphthylimido trifluoromethane sulfonate or mixtures thereof.

The photoacid generator can further comprise a compound selected from the group consisting of diphenyl iodide hexafluorophosphate, diphenyl iodide hexafluoroarsenate, diphenyl iodide hexafluoroantimonate, diphenyl p-methoxyphenylsulfonium triflate, diphenyl p-toluenylsulfonium triflate, diphenyl p-isobutylphenylsulfonium triflate, diphenyl p-tert-butylphenylsulfonium triflate, triphenylsulfonium hexafluoroarsenate, triphenylsulfonium hexafluoroantimonate, triphenylsulfonium triflate, dibutylnaphthylsulfonium triflate and mixtures thereof.

Typically, the amount of photoacid generator ranges from about 0.05 to about 10% by weight of the photoresist polymer employed. It has been found that when the photoacid generator is used in the amount less than about 0.05%, it lowers photosensitivity of the photoresist composition, and when the photoacid generator is used in the amount greater than about 10%, it results in a poor pattern formation due to its high absorption.

On the other hand, any of conventional organic solvent can be employed for this invention and some of the conventional one are also disclosed in the documents described above. Preferred organic solvents for photoresist composition is methyl 3-methoxypropionate, ethyl 3-ethoxypropionate, propylene glycol methyl ether acetate, cyclohexanone, 2-heptanone, ethyl lactate or mixtures thereof.

The amount of organic solvent ranges from about 500 to about 2000% by weight of the photoresist polymer to coat the photoresist in a wanted thickness. It has been found that when the organic solvent is used in the amount of 1000 wt %, a thickness of the photoresist is about 0.25 µm.

The present invention also provides a process for forming a photoresist pattern comprising:

(a) coating the photoresist composition described above on a substrate to form a photoresist film;

(b) exposing the photoresist film to light; and (c) developing the exposed photoresist film to obtain a photoresist pattern.

The process for forming the photoresist pattern can further include a soft baking which is performed before the step (b) and/or a post baking step which is performed after the step (b). Preferably, the soft and post baking steps are performed at temperature in the range from about 70 to about 200° C.

Exemplary light sources which are useful for forming the photoresist pattern include not only VUV but also ArF, KrF, E-beam, EUV or ion beam. Preferably, the irradiation energy in the step (b) is in the range between about 1 $mJ/cm^2$ and about 100 $mJ/cm^2$.

On the other hand, the step (c) can be performed in alkaline developing solution which is preferably TMAH aqueous solution with a concentration ranging from about 0.01 to about 5 wt %.

In addition, a semiconductor device can be manufactured using the photoresist composition described above.

The disclosed polymers and photoresist compositions will now be described in more details by referring to examples below, which are not intended to be limiting.

I. Preparation of Photoresist Polymers

EXAMPLE 1

Synthesis of poly(hexafluorocyclobutene/2-methyl 2-adamantyl 5-norbornene-2-carboxylate)

To 20 mL of anhydrous tetrahydrofuran was added hexafluorocyclobutene (0.1 mole), 2-methyl 2-adamantyl 5-norbornene-2-carboxylate (0.1 mole) and AIBN(0.3 g), and was passed through nitrogen thereby removing general air. And the resulting solution was shielded thoroughly and reacted at about 90° C. for about 10 hours. Thereafter, a polymer was precipitated and filtered in mixture solution of methanol and water, thereby obtaining the entitled compound (yield: 35%).

EXAMPLE 2

Synthesis of poly(octafluorocyclopentene/8-ethyl 8-tricyclodecanyl 5-norbornene-2-carboxylate)

To 20 mL of anhydrous tetrahydrofuran was added octafluorocyclopentene (0.1 mole), 8-ethyl 8-tricyclodecanyl 5-norbornene-2-carboxylate (0.1 mole) and AIBN (0.3 g), and was passed through nitrogen thereby removing general air. And the resulting solution was shielded thoroughly and reacted at about 90° C. for about 10 hours. Thereafter, a polymer was precipitated and filtered in mixture solution of methanol and water, thereby obtaining the entitled compound (yield: 36%).

EXAMPLE 3

Synthesis of poly(octafluorocyclopentene/2-methyl 2-adamantyl 5-norbornene-2-carboxylate/2-ethyl 2-adamantyl acrylate)

To 20 mL of anhydrous tetrahydrofuran was added octafluorocyclopentene (0.05 mole), 2-methyl 2-adamantyl 5-norbornene-2-carboxylate(0.05 mole), 2-ethyl 2-adamantyl acrylate (0.05 mol), and AIBN (0.3 g), and was passed through nitrogen thereby removing general air. And the resulting solution was shielded thoroughly and reacted at about 90° C. for about 10 hours. Thereafter, a polymer was precipitated and filtered in mixture solution of methanol and water, thereby obtaining the entitled compound (yield: 39%).

EXAMPLE 4

Synthesis of poly(hexafluorocyclobutene/4-ethoxyethoxy styrene/4-hydroxy styrene)

(Step 1) Synthesis of poly(hexafluorocyclobutene/4-acetoxy styrene)

To 20 mL of anhydrous tetrahydrofuran was added hexafluorocyclobutene (0.1 mole), 4-acetoxy styrene(0.15 mole) and AIBN(0.3 g), and was passed through nitrogen thereby removing general air. And the resulting solution was shielded thoroughly and reacted at about 90° C. for about 10 hours. Thereafter, a polymer was precipitated and filtered in mixture solution of methanol and water, thereby obtaining the entitled compound (yield: 56%).

(Step 2) Synthesis of poly(hexafluorocyclobutene/4-hydroxy styrene)

To mixture solution which is 20 mL of methanol and 30 mL of 1N hydrochloric acid was added poly (hexafluorocyclobutene/4-acetoxy styrene) obtained in Step 1(0.05 mole). And the resulting solution was reacted at about 50° C. for about 10 hours, thereby obtaining the entitled compound (yield: 95%).

(Step 3) Synthesis of poly(hexafluorocyclobutene/4-ethoxyethoxy styrene/4-hydroxy styrene)

To 10 mL of tetrahydrofuran was added poly (hexafluorocyclobutene/4-hydroxy styrene) obtained in Step 2(0.04 mole) and sulfuric acid(0.1 mL), and the resulting solution was stirred at room temperature for about 10 minutes. And then ethylvinylether was injected a reactor containing the resulting solution and stirred for about 10 hours. Thereafter, a polymer was precipitated and filtered in mixture solution of methanol and water, thereby obtaining the entitled compound substituted some hydrogens of hydroxyl group with ethoxyethyl which is acid labile protecting group (yield: 92%).

II. Preparation of Photoresist Compositions and Formation of Patterns

EXAMPLE 5

Preparation of Photoresist Compositions and Formation of Patterns (1)

To 50 g of propylene glycol methyl ether acetate (PGMEA) was added 5 g of the photoresist polymer obtained in Example 1, 0.03 g of phthalimidotrifluoromethane sulfonate, and 0.03 g of triphenylsulfonium triflate. The polymer was precipitated and filtered in 0.20 µm filter to obtain a photoresist composition.

The photoresist composition thus prepared was spin-coated on silicon wafer to form a photoresist film, and soft-baked at about 110° C. for about 90 seconds. After baking, the photoresist was exposed to light using a ArF laser exposer, and then post-baked at about 110° C. for about 90 seconds. When the post-baking was completed, it was developed in 2.38 wt % aqueous TMAH solution for about 40 seconds, to obtain 0.12 µm L/S pattern (see FIG. 1).

EXAMPLE 6

Preparation of Photoresist Compositions and Formation of Patterns (2)

To 70 g of propylene glycol methyl ether acetate (PGMEA) was added 10 g of the photoresist polymer obtained in Example 2, 0.06 g of phthalimidotrifluoromethane sulfonate, and 0.06 g of triphenylsulfonium triflate. The polymer was precipitated and filtered in 0.20 µm filter to obtain a photoresist composition.

Figure 2:
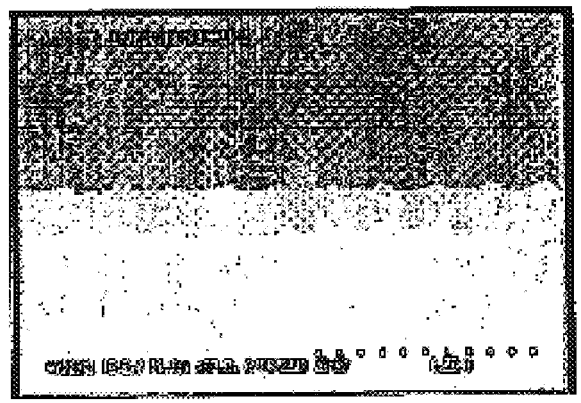
FIG. 2 is a photograph of a photoresist pattern obtained in Example 6.

The photoresist composition thus prepared was spin-coated on silicon wafer to form a photoresist film, and soft-baked at about 110° C. for about 90 seconds. After baking, the photoresist was exposed to light using a ArF laser exposer, and then post-baked at about 110° C. for about 90 seconds. When the post-baking was completed, it was developed in 2.38 wt % aqueous TMAH solution for about 40 seconds, to obtain 0.12 µm L/S pattern (see FIG. 2).

EXAMPLE 7

Preparation of Photoresist Compositions and Formation of Patterns (3)

To 70 g of propylene glycol methyl ether acetate (PGMEA) was added 10 g of the photoresist polymer obtained in Example 3, 0.06 g of phthalimidotrifluoromethane sulfonate, and 0.06 g of triphenylsulfonium triflate. The polymer was precipitated and filtered in 0.20 µm filter to obtain a photoresist composition.

Figure 3:
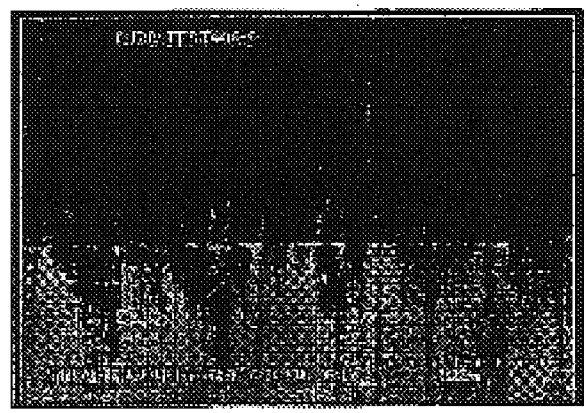
FIG. 3 is a photograph of a photoresist pattern obtained in Example 7.

The photoresist composition thus prepared was spin-coated on silicon wafer to form a photoresist film, and soft-baked at about 110° C. for about 90 seconds. After baking, the photoresist was exposed to light using a ArF laser exposer, and then post-baked at about 110° C. for about 90 seconds. When the post-baking was completed, it was developed in 2.38 wt % aqueous TMAH solution for about 40 seconds, to obtain 0.12 µm L/S pattern (see FIG. 3).

EXAMPLE 8

Preparation of Photoresist Compositions and Formation of Patterns (4)

To 70 g of propylene glycol methyl ether acetate (PGMEA) was added 10 g of the photoresist polymer obtained in Example 4, 0.06 g of phthalimidotrifluoromethane sulfonate, and 0.06 g of triphenylsulfonium triflate. The polymer was precipitated and filtered in 0.20 μm filter to obtain a photoresist composition.

Figure 4:
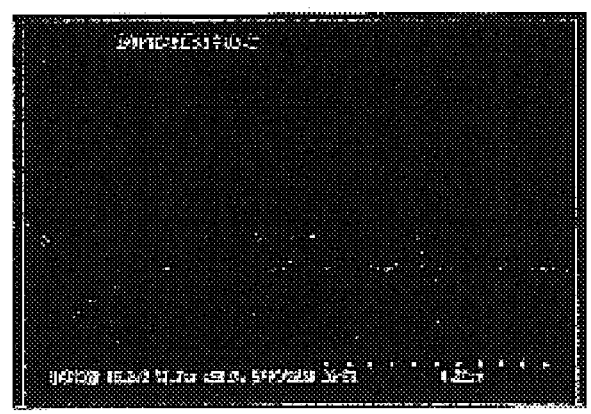
FIG. 4 is a photograph of a photoresist pattern obtained in Example 8.

The photoresist composition thus prepared was spin-coated on silicon wafer to form a photoresist film, and soft-baked at about 110° C. for about 90 seconds. After baking, the photoresist was exposed to light using a ArF laser exposer, and then post-baked at about 110° C. for about 90 seconds. When the post-baking was completed, it was developed in 2.38 wt % aqueous TMAH solution for about 40 seconds, to obtain 0.12 μm L/S pattern (see FIG. 4).

EXPERIMENTAL EXAMPLE

Examination of Absorbance at 157 nm

Figure 5:
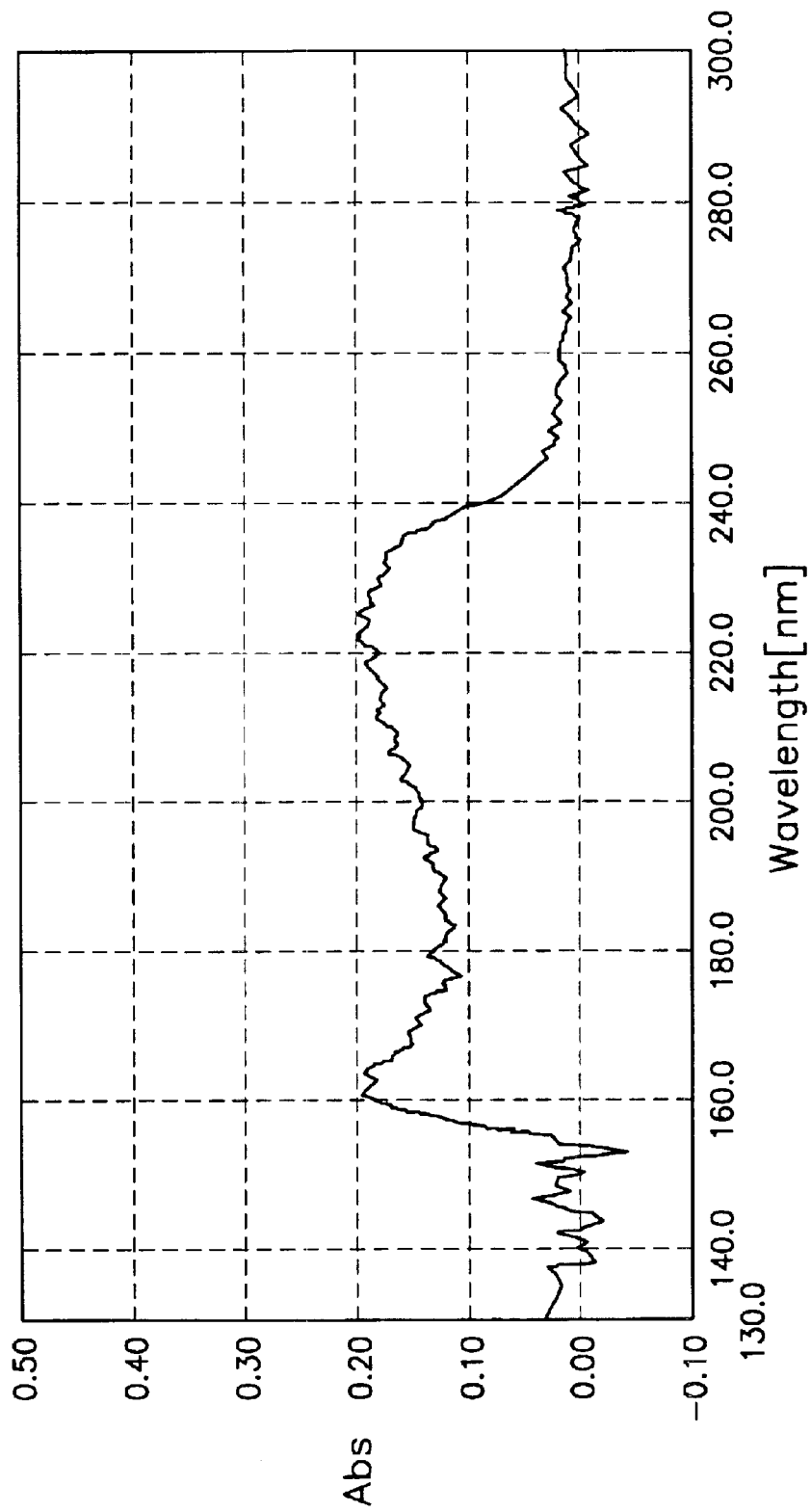
FIG. 5 is a VUV spectrum for a photoresist composition obtained in Example 8.

Absorbance of photoresist composition obtained in Example 8 coated in a thickness of 2500 Å was shown by VUV spectrum of FIG. 5. According to FIG. 5, the absorbance of the photoresist composition of Example 8 at 157 nm wavelength was 0.18, which was merely a third of the absorbance of conventional photoresist for KrF or ArF light source at 157 nm. Thus, the conventional photoresist composition should be coated in a thickness of 600–700 Å or less to satisfy the requisite of light transmittance for a lithography process employing 157 nm light source, while the photoresist composition according to the present invention, having high light transmittance for 157 nm light source, can provide efficient pattern even when it coated in a thickness of 1500 Å or more.

The photoresist composition according to the present invention ensures enhanced etching resistance, as it allows formation of photoresist film in a sufficient thickness.

From Experimental Example, it is noticed that the composition comprising the photoresist polymer according to the present invention has excellent light transmittance at 157 nm wavelength, so that it can be usefully employed for a photolithography process using 157 nm light source. In addition, from Examples 5 to 8, it is ascertained that the photoresist composition comprising the photoresist polymer according to the present invention has effective physical property as a photoresist.

As discussed earlier, a photoresist pattern having excellent durability, etching resistance, and developable property can be formed successfully by employing the photoresist composition of the present invention. And the photoresist composition of the present invention can be used in forming a minute pattern below 1 G DRAM as well as 4 G and 16 G. Moreover, the photoresist polymer of the present invention has a low light absorbance at the 157 nm wavelength, and thus is suitable for a photolithography using VUV.

What is claimed is:
1. A photoresist polymer comprising a repeating unit selected from the group consisting of Formula 2 and Formula 3;

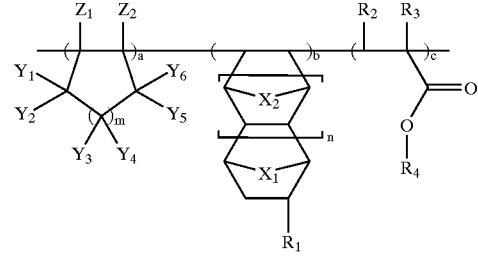

Formula 2

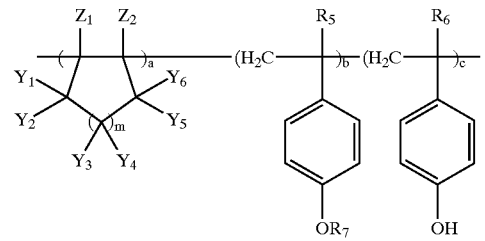

Formula 3 wherein $R_1$ is selected from the group consisting of H, halogen, $(C_1-C_{20})$ alkyl, $(C_1-C_{20})$ alkyl with at least one halogen substituent, $(C_1-C_{20})$ alkyl containing at least one of an ether group (—O—) and an ester group, $(C_1-C_{20})$ alkyl with at least one halogen substituent and containing at least one of an ether group and an ester group, and —COOR';

$R_2$, $R_3$, $R_5$ and $R_6$ are individually selected from the group consisting of H, halogen, $(C_1-C_{20})$ alkyl, $(C_1-C_{20})$ alkyl with at least one halogen substituent, $(C_1-C_{20})$ alkyl containing at least one of an ether group and an ester group and $(C_1-C_{20})$ alkyl with at least one halogen substituent and containing at least of one of an ether group and an ester group;

R', $R_4$ and $R_7$ are individually acid labile protecting groups, wherein $R_4$ is not t-butyl;

$X_1$ and $X_2$ are individually selected from the group consisting of $(C_1-C_{10})$ alkylene, O and S;

$Y_1, Y_2, Y_3, Y_4, Y_5, Y_6, Z_1$ and $Z_2$ are individually selected from the group consisting of halogen, an alkyl partially substituted with halogen, and an alkyl wholly substituted with halogen;

m and n are individually integers ranging from 0 to 2;

the ratio a:b:c of Formula 2 falls within the range 1–50 mol %:present and in an amount up to and including 90 mol %: 0–9° mol %; and the ratio a:b:c of Formula 3 falls within the range 1–50 mol %=0–90 mol %:0–90 mol %, wherein at least one of b and c must be present.

2. The photoresist polymer according to claim 1, wherein the $R_2$, $R_3$, $R_5$ and $R_6$ are individually selected from the group consisting of H, F, $(C_1-C_{20})$ alkyl, $(C_1-C_{20})$ perfluoroalkyl, $(C_1-C_{20})$ alkyl containing at least one of an ether group and an ester group, $(C_1-C_{20})$ perfluoroalkyl containing at least one of an ether group and an ester group, $(C_1-C_{20})$ alkyl partially substituted with F, and $(C_1-C_{20})$ alkyl partially substituted with F and containing at least one of an ether group and an ester group.

3. The photoresist polymer according to claim 1, wherein the $Y_1$, $Y_2$, $Y_3$, $Y_4$, $Y_5$, $Y_6$, $Z_1$ and $Z_2$ are individually selected from the group consisting of F, Cl, Br, I and $CF_3$.

4. The photoresist polymer according to claim 1, wherein the acid labile protecting group is selected from the group consisting of 2-methyl 2-adamantyl, 2-ethyl 2-adamantyl, 8-ethyl 8-tricyclodecanyl, tetrahydropyran-2-yl, 2-methyl tetrahydropyran-2-yl, tetrahydrofuran-2-yl, 2-methyl tetrahydrofuran-2-yl, 1-methoxypropyl, 1-methoxy-1-methylethyl, 1-ethoxypropyl, 1-ethoxy-1-methylethyl, 1-methoxyethyl, 1-ethoxyethyl, tert-butoxyethyl, 1-isobutoxyethyl and 2-acetylmenth-1-yl.

5. The photoresist polymer according to claim 1, wherein the repeating unit of Formula 2 is selected from the group consisting of poly(hexafluorocyclobutene/2-methyl 2-adamantyl 5-norbornene-2-carboxylate), poly(octafluorocyclopentene/8-ethyl 8-tricyclodecanyl 5-norbornene-2-carboxylate) and poly(octafluorocyclopentene/2-methyl 2-adamantyl 5-norbornene-2-carboxylate/2-ethyl 2-adamantyl acrylate).

6. The photoresist polymer according to claim 1, wherein the repeating unit of Formula 3 is poly(hexafluorocyclobutene/4-ethoxyethoxy styrene/4-hydroxy styrene).

7. A photoresist composition comprising:
   (i) the photoresist polymer of claim 1;
   (ii) an organic solvent; and
   (iii) a photoacid generator.

8. The photoresist composition according to claim 7, wherein the photoacid generator is selected from the group consisting of phthalimidotrifluoromethane sulfonate, dinitrobenzyltosylate, n-decyl disulfone and naphthylimido trifluoromethane sulfonate.

9. The photoresist composition according to claim 8, wherein the photoacid generator further comprises a compound selected from the group consisting of diphenyl iodide hexafluorophosphate, diphenyl iodide hexafluoroarsenate, diphenyl iodide hexafluoroantimonate, diphenyl p-methoxyphenylsulfonium triflate, diphenyl p-toluenylsulfonium triflate, diphenyl p-isobutylphenylsulfonium triflate, diphenyl p-tert-butylphenylsulfonium triflate, triphenylsulfonium hexafluororphosphate, triphenylsulfonium hexafluoroarsenate, triphenylsulfonium hexafluoroantimonate, triphenylsulfonium triflate, dibutyl-naphthylsulfonium triflate and mixtures thereof.

10. The photoresist composition according to claim 7, wherein the photoacid generator is present in an amount ranging from about 0.05 to about 10% by weight of the photoresist polymer.

11. The photoresist composition according to claim 7, wherein the organic solvent is selected from the group consisting of methyl 3-methoxypropionate, ethyl 3-ethoxypropionate, propylene glycol methyl ether acetate, cyclohexanone, 2-heptanone, ethyl lactate and mixtures thereof.

12. The photoresist composition according to claim 7, wherein the organic solvent is present in an amount ranging from about 500 to about 2000% by weight of the photoresist polymer.

* * * * *